(12) United States Patent
Ukil et al.

(10) Patent No.: US 10,027,105 B2
(45) Date of Patent: Jul. 17, 2018

(54) OVERCURRENT PROTECTION DEVICE AND METHOD

(71) Applicant: ABB Research Ltd., Zurich (CH)

(72) Inventors: Abhisek Ukil, Singapore (SG); Julio Danin Lobo, Baden (CH)

(73) Assignee: ABB Research Ltd., Zurich (CH)

( * ) Notice: Subject to any disclaimer, the term of this patent is extended or adjusted under 35 U.S.C. 154(b) by 333 days.

(21) Appl. No.: 14/847,187

(22) Filed: Sep. 8, 2015

(65) Prior Publication Data

US 2015/0380923 A1    Dec. 31, 2015

Related U.S. Application Data

(63) Continuation of application No. PCT/EP2014/054453, filed on Mar. 7, 2014.

(30) Foreign Application Priority Data

Mar. 8, 2013 (EP) .................................. 13158366

(51) Int. Cl.
| | |
|---|---|
| *H02H 3/00* | (2006.01) |
| *H02H 3/08* | (2006.01) |
| *H02H 7/22* | (2006.01) |
| *G01R 19/00* | (2006.01) |
| *H02H 1/00* | (2006.01) |
| *H02H 7/26* | (2006.01) |

(52) U.S. Cl.
CPC ......... *H02H 3/083* (2013.01); *G01R 19/0092* (2013.01); *H02H 7/226* (2013.01); *H02H 1/0007* (2013.01); *H02H 7/263* (2013.01)

(58) Field of Classification Search
CPC ....................................................... H02H 3/083
USPC ...................................................... 361/93.1
See application file for complete search history.

(56) References Cited

U.S. PATENT DOCUMENTS

| | | | |
|---|---|---|---|
| 5,134,362 A | 7/1992 | Ochi | |
| 5,453,903 A | 9/1995 | Chow | |
| 6,397,156 B1 | 5/2002 | Bachmann et al. | |
| 6,608,481 B1 * | 8/2003 | Piazza | H01H 33/027 218/63 |
| 8,242,402 B2 * | 8/2012 | Bohnert | G01R 15/247 218/46 |
| 2006/0170410 A1 | 8/2006 | Bjorn | |

OTHER PUBLICATIONS

Maamoon F Al Kababjie et al: "A fault detection and classification using new distance relay", Renewable Energies and Vehicular Technology (REVET), 2012 First International Conference on, IEEE, Mar. 26, 2012 (Mar. 26, 2012), pp. 237-243.

(Continued)

*Primary Examiner* — Stephen W Jackson
(74) *Attorney, Agent, or Firm* — Whitmyer IP Group LLC (57) ABSTRACT

A power line protection system and method are described with a current meter for monitoring the current in the protected power line and a circuit breaker, with the current meter including a sensor, particularly a fiber optic current sensor, for monitoring a direct current component in the current transmitted and an analyzer for testing the direct current component and for generating a fault signal for the circuit breaker.

18 Claims, 4 Drawing Sheets

(56) References Cited

OTHER PUBLICATIONS

Joe-Air Jiang et al: "A fault detection and faulted-phase selection approach for transmission lines with haar wavelet transform", 2003 IEEE PES Transmission and Distribution Conference. Conference Proceedings. Dallas, TX, Sep. 7-12, 2003; [IEEE/PES Transmission and Distribution Conference and Exposition], New York, NY : IEEE, US, vol. 1, Sep. 7, 2003 (Sep. 7, 2003), pp. 285-289.
Karegar H K et al: "A new method for fault detection during power swing in distance protection", Electrical Engineering/ Electronics, Computer, Telecommunications and Information Technology, 2009. ECTI-CON 2009. 6th International Conference on, IEEE, Piscataway, NJ, USA, May 6, 2009 (May 6, 2009), pp. 230-233.
European Search Report Application No. EP 13 15 8366 Completed: Jul. 17, 2013; dated Jul. 24, 2013 5 pages.
R. Hunt, "Impact of CT errors on protective relays—case studies and analyses," IEEE Transactions Industry Applications, vol. 48, No. 1, pp. 52-61, Jan./Feb. 2012.
International Preliminary Report of Patentability Application No. PCT/EP2014/054453 dated Mar. 13, 2013 7 pages.
Internation Search Report and Written Opinion of the International Searching Authority Application No. PCT/EP2014/054453 Completed: May 28, 2014; dated Jun. 10, 2014 11 pages.
P. Schaub, et al., "Test and Evaluation of Non Conventional Instrument Transformers and Sampled Value Process Bus on Powerlink's Transmission Network," SEAPAC Mar. 2011 34 (or 59) p. 1-18, Sydney, Australia.

* cited by examiner

OVERCURRENT PROTECTION DEVICE AND METHOD

FIELD OF THE INVENTION

The present invention relates to a device and a method for protecting sections of a power network, particularly substations, in the event of a fault.

BACKGROUND OF THE INVENTION

In a power distribution system, electrical transmission lines and power generation equipment must be protected against faults and short circuit events. Otherwise, such faults and short circuits can cause a collapse of the system, equipment damage, and/or personal injury. Accordingly, a typical power system employs one or more protective relays to monitor impedance and other AC voltage and current characteristics on a protected transmission line, so as to sense faults and short circuits on such protected line, and to appropriately isolate such faults and short circuits from the remainder of the power system by tripping pre-positioned circuit breakers on the protected line or lines.

In order to perform their task the relays receive current measurements performed on secondary circuits separated from the protected line by a current transformer (CT). Current transformers form the basic interconnection between the actual power system and almost all the measuring devices such as the protective relays. A CT steps the primary current down to a secondary level for use by the measuring device.

Due to their essential nature as devices with a primary and secondary winding coupled by the magnetic flux in a saturable iron core, CTs have known problems reproducing the primary current during fault events outside their designated specifications. As discussed for example in R. Hunt, "Impact of CT errors on protective relays—case studies and analyses," IEEE Transactions Industry Applications, vol. 48, no. 1, pp. 52-61, 2012, the major sources of these problems are typically recognized as saturation effects, DC effects and remanent magnetic flux. To avoid errors in the reproduction of the secondary current, a CT is typically designed according to carefully drafted specifications taking into account the typical errors and their estimated magnitudes. Alternatively, or in addition, the saturation effects can be compensated for through the use of compensation algorithms as known in the art.

As described for example in the U.S. Pat. No. 6,397,156, it is further known that in uncompensated and compensated power systems a fault current waveform will contain an exponentially decaying DC offset component in addition to a fundamental frequency. The amount of the DC offset current is dependent on the fault inception angle and system parameters such as network configuration, number and length of transmission lines, compensation percentage, power flow, generator and transformer impedances, etc. In CT measurements the DC offset current is typically seen as an error and a variety of algorithms have been devised to compensate for the DC offset in current transformers. Some algorithms use a differentiation technique that eliminates the effect of the DC offset and ramp components in the fault current waveform. Mimic circuits and cosine filters have also been employed.

In SEAPAC 2011 34 (or 59) p. 1-18, "Test and Evaluation of Non Conventional Instrument Transformers and Sampled Value Process Bus on Powerlink's Transmission Network" by P. Schaub et al., a commercially available fiber optical current sensor (FOCS) is described linked together with a CT to a power line for test and evaluation purposes. A paper published in CIGRE 2012 B3-101 "Real-time Monitoring and Capture of Power System Transients" by D. F. Peelo et al. discusses transient measurement using optical voltage and current transformers.

US 2006/170410 A1 discloses a calibration method for a fiber-optic Faraday-effect current sensor (FOCS) in a power network. This calibration method makes use of a DC component present in the current measurement signal. For calibrating the sensor, the DC component of the measured AC value is compared to a stored DC signal value which was measured early during calibration of the system, and the percentage change from the calibrated DC component is multiplied to the AC component. Furthermore, the measured DC signal component is extracted from the FOCS measurement signal and is then subtracted and thus removed from the FOCS measurement signal. Therefore, the calibrated FOCS sensor signal is AC only and cannot be used to measure a DC signal component.

Joe-Air Jiang et al., "A Fault Detection and Faulted-Phase Selection Approach for Transmission Lines with Haar Wavelet Transform", 2003 IEEE PES Transmission and Distribution Conference, Dallas, Tex., Sep. 7-12, 2003, p. 285-289 discloses a power line protection algo-rithm using the abrupt direct offset (DC) component of the current as a fault detection indicator. Simulated systems are discussed.

The invention starts from H. K. Karegar et al., "A new method for fault detection during power swing in distance protection", Electrical Engineering/Electro-nics, Computer, Telecommunications and Information Tech-nology, 2009, ECTI-CON 2009, 6U International Conference IEEE, Piscataway, N.J., USA, 6 May 2009, p. 230-233. This article discloses a power line protection algorithm based on the DC component of fault currents being used for de-tecting a fault during power swing blockage of distance relays. Each phase current is measured and analyzed, the DC components are obtained and compared to thresholds, and if the DC components are bigger than the thresholds, the fault will be detected.

F. Maamoon al Kabajie et al., "A fault detec-tion and classification using new distance relay", Renewble Energies and Vehicular Technology (Revet), 2012, First International Conference IEEE, 26 Mar. 2012, p. 237-243 discloses a power line protection algorithm using the abrupt direct offset (DC) component of the current as a fault detection indicator. Simulated and practical results are discussed.

U.S. Pat. No. 5,134,362 A discloses an apparatus for de-tecting failure in AC power systems using a first and second Faraday device whose output is processed by an electric circuit comprising a band-pass filter and a DC filter. The DC components correspond to cases with no magnetic field or magnetic fields of same direction being applied to the Faraday devices, whereas the AC components correspond to a magnetic field applied to either Faraday device or to magnetic fields applied to both Faraday devices in opposite directions. The output of the DC filter is used to normalize the output of the band-pass filter to eliminate errors due to differences in light attenuation in the optical fibers.

SUMMARY OF THE INVENTION

It is an objective of the invention to provide an improved device and method for monitoring the current in a protected power line, with such device and methods being capable of reducing the time required to generate a control or trip signal for a circuit breaker. This objective is achieved by the subject-matter of the independent claims. Exemplary embodiments are given in dependent claims and in combinations thereof as well as in the following description and in the drawings.

Hence, according to a first aspect of the invention, there is provided a power line protection system with a current meter for monitoring the current in the protected power line and a circuit breaker wherein the current meter comprises a sensor for monitoring a direct current component in the current transmitted and an analyser testing the DC component and generating a fault signal for the circuit breaker.

As used herein, the term "protected power line" includes any type of electrical conductor, such as a high power conductor, feeder, transformer winding, etc.

In a preferred variant of this aspect of the invention, the sensor includes a fiber optic current sensor (FOCS).

In a further preferred variant of this aspect of the invention, the analyser is programmed to use the onset of a DC component in transmitted current to generate a control or trip event for the circuit breaker. The onset can be detected very fast, making it possible for the analyser to issue a trip command in less than one cycle time of the power system, i.e. less than 20 ms in a 50 Hz power system, preferably in even less than half a cycle time and even more preferably essentially instantaneously, as the onset of the DC current can be measured without having to measure a full waveform or even only part of the waveform. This is a significant advantage over systems using a CT in the measuring system.

In another preferred variant the analyser is integrated with the control circuit of the sensor enabling the sensor to transmit either in addition to the measured data or solely a trip command or the precursor to a trip command to relays or other devices positioned in the circuit between the sensor and the circuit breaker(s) or directly to the circuit breaker(s). Such an integration of the analyser into the sensor electronics is useful to simplify the design of any relay connected to the sensor and potentially shorten the delay between the occurrence of a fault and the activation of the circuit breaker(s).

In embodiments, the analyser can be part of a current sensor module receiving and processing analog input from the fiber optic current sensor FOCS.

In embodiments, the analyser is part of a relay connected to a current sensor module receiving analog input from the fiber optic current sensor FOCS via a broadband data transmission link.

In embodiments the above system is integrated into the protection system of a substation connected to power lines at a potential of 35 kV or more.

In a preferred variant, the current measurement installation to protect the substation is free of sulphur hexafluoride ($SF_6$) and thus more environmentally friendly than many of the existing installations.

According to a second aspect of the invention, there is provided a method of protecting a power line including the steps of monitoring the current in the power for the presence of a DC component and at the occurrence of the DC component activating directly or indirectly the circuit breaker. In a preferred variant, the method includes the step of analysing the waveform of the DC offset current as derived for example from direct measurement and/or measurements and extrapolation using a model of the current.

The above and other aspects of the present invention together with further advantageous embodiments and applications of the invention are described in further details in the following description and figures.

DETAILED DESCRIPTION OF THE INVENTION

Figure 1A:
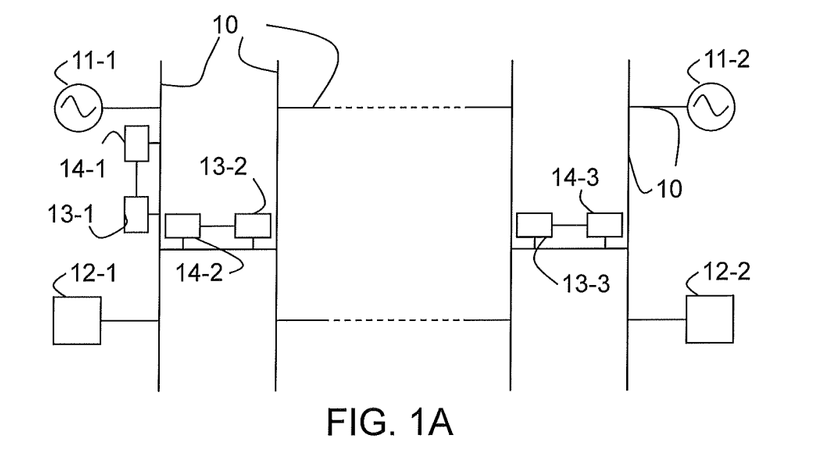
FIG. 1A is a schematic diagram of a power system with protected lines.

A typical power system is shown in FIG. 1A illustrating a network of power lines 10 transporting electrical power between one or more generators 11-1, 11-2 at one or more locations to one or more power consumers or loads 12-1, 12-2, which are also typically located at one and more locations. Transmission lines (the main horizontal lines in FIG. 1A) distribute power from the generators to secondary lines or buses (the main vertical lines in FIG. 1A), and such buses eventually lead to power loads 12-1, 12-2. The power lines 10 are often grouped according to their operating voltages ranging from domestic lines operating below one kV to industrial or small distribution lines below 35 kV to high voltage transmission lines operating at voltages above 100 kV. Step-up and step-down transformers (not shown) are used to convert voltage levels for transporting power between different voltage levels.

Generators, transformers, distribution stations and loads on the network are typically protected against faults on the network such that a faulty part of the network can be separated from the remaining parts. For the higher voltage distribution lines, this separation is done by one or more circuit breakers 13-1, 13-2. The circuit breakers 13-1, 13-2, 13-3 are controlled or tripped by one or more protective relays 14-1, 14-2, 14-3 which monitor impedance and other AC voltage and current characteristics on a protected transmission line 10 to sense faults and short circuits on such protected line 10 and isolate such faults and short circuits from the remainder of the power system by tripping pre-positioned circuit breakers 13-1, 13-2, 13-3 on such protected lines 10.

As seen, a typical power system can be connected over a wide area and include multiple power generators 11-1, 11-2 and loads 12-1, 12-2 at different locations. The relays 14-1, 14-2, 14-3 and circuit breakers 13-1, 13-2, 13-3 are positioned appropriately to perform isolating operations as described above.

Figure 1B:
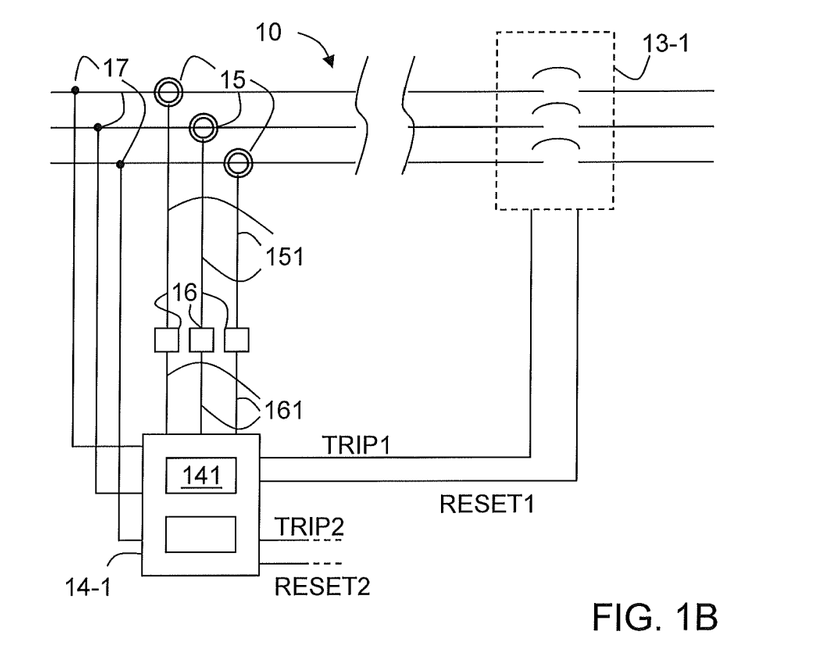
FIG. 1B shows a current sensor linked to a relay in accordance with an example of the invention.

A current sensor 15 with a protective relay 14-1 in accordance with an example of the invention is shown in FIG. 1B. The current sensor 15 includes three FOCS probes each positioned to measure the current through one of the three phases of the power line 10. FOCS are commercially available and described for example in the ABB® brochure "FOCS—Fiber-Optic Current Sensor. Make light work of DC current measurement" available from the www.abb.com web-site.

The FOCS system utilizes the Faraday effect to measure current. The probe includes a loop of optical fiber wound around a power line, power cable, or process bar. The FOCS system replaces the complicated and bulky sensor heads of conventional transducers such as Hall effect CTs. The Faraday effect can be observed when polarized light waves are exposed to a magnetic field. As a result, the waves accumulate a phase difference. In the FOCS system, the right and left circularly polarized light waves travel through the coil of the sensing fiber. At the end of the fiber, they are reflected (and their polarization direction is swapped) and then retrace their optical path to a sensor electronics module 16 via a fiber-optic cable 151. The sensor module 16 contains the light source, an optical phase detection circuit and a digital signal processor (DSP). The digital signal processor within the module 16 converts the optical phase difference directly into a digital signal, which can then be transmitted for analysis to the relay 14-1.

If a current is flowing, the waves accumulate a phase difference which is proportional to the line integral of the magnetic field along the sensing fiber. This difference is therefore a direct and precise measure for the current, here in particular the current transmitted through a power line 10.

The sensors modules 16 are connected to the relay 14-1 via data transmission lines 161. In a variant of this example the data transmission line 161 is a high speed or broadband transmission line to not limit the number of samplings to be transferred to the relay 14-1. The capacity of the high speed transmission line 161 between the sensor modules 16 and the relay 14-1 is designed to allow for the transmission of high speed sampling results, for example at sampling rates of 30 kHz or above, i.e. equivalent to over 500 samples per 60 Hz cycle, or at sampling rates of 100 kHz or above. To accelerate the data transfer to the relay, the high speed transmission line 161 can be designed to allow for 1 MHz sampling or higher to ensure that it is not a bottleneck between the sampling of the FOCS 15 and the signal processing performed within the relay 14-1.

The relay 14-1 can also be connected to voltmeters 17 to record voltage in addition to the current waveforms on a corresponding protected line 10. The additional voltage signal can be used to determine for example the location of a fault.

Based on the input received from the current sensors 15 alone or from the current and voltage sensors 15, 17, a processor 141 within the protective relay 14-1 can decide whether to trip an associated circuit breaker 13-1, thereby isolating a portion of the power system. For that purpose, the relay 14-1 issues a command over a 'TRIP' output (TRIP 1 in FIG. 1B) that is received as an input by the circuit breaker 13-1. The relay 14-1 may then reset the circuit breaker 13-1 after it senses that the fault has been cleared, or after otherwise being ordered to do so, by issuing such a command over a 'RESET' output (RESET 1 in FIG. 1B) that is received as an input by the circuit breaker 13-1.

A relay 14-1 can control several circuit breakers (only one being shown in FIG. 1B), as indicted by the TRIP 2 and RESET 2 output lines in FIG. 1B. Additionally, the circuit breakers may be set up to control one or more specific phases of a power line, rather than all of the phases of the line 10 as shown. Owing to the relatively large distances over which a power system can extend, the distance between a relay and one or more of its associated circuit breakers can be substantial. As a result, the outputs from the relay may be received by the circuit breaker(s) by way of any feasible transmission method, including hard wire line, radio transmission, optical link, satellite link, and the like.

Whilst the above variant of the example uses a high speed data link 161 between the sensor electronics module 16 and the relay 14-1, it is possible to include a data compression system (not shown) in the sensor module 16, thus reducing the data traffic between sensor module 16 and the relay 14-1.

The data compression can be used for example in legacy systems where the relays are not configured to receive data at a high transmission rate. As an example of this variant the signal processing unit in the sensor module 16 can for example be adapted to monitor for the presence of a DC component in the measured current, thus assuming at least part of the processing conventionally performed within the signal processing unit 141 of the relay 14-1. Depending on the degree or amount of processing performed with in the sensor module 16, the data traffic to the relay can be reduced in the event of a fault to a simple signal indicating the presence of such fault. In other variants the processing unit in the module 16 can be adapted to compress the sampled signals using standard data compression methods to improve the data transfer to the relay even via a narrowband transmission line.

The above protection system is particularly suited for primary substation protection with connected power lines 10 operating at a potential of 35 kV or above. The sensors 15 can be installed without the bulky insulation required for conventional current transformers. Specifically, it is possible to install the sensor head around the power lines using an installation free of sulphur hexafluoride ($SF_6$) at potential levels above 35 kV and even above 100 kV. In combination with an $SF_6$-free circuit breaker 13-1 implemented for example as vacuum circuit breaker it is thus possible to have a protection system for primary substations or other high-voltage installations free of $SF_6$. Such an $SF_6$-free protection system on the high-voltage part of the power grid represents a great benefit to the environment.

For the purposes of this disclosure the dielectric fluid used in the electrical installation, e.g. in the circuit breaker, can be $SF_6$ gas or any other dielectric insulation medium, may it be gaseous and/or liquid, and in particular can be a dielectric insulation gas or arc quenching gas. Such dielectric insulation medium can for example encompass media comprising an organofluorine compound, such organofluorine compound being selected from the group consisting of: a fluoroether, an oxirane, a fluoroamine, a fluoroketone, a fluoroolefin, and mixtures and/or decomposition products thereof. Herein, the terms "fluoroether", "oxirane", "fluoroamine", "fluoroketone" and "fluoroolefin" refer to at least partially fluorinated compounds. In particular, the term "fluoroether" encompasses both hydrofluoroethers and perfluoroethers, the term "oxirane" encompasses both hydrofluorooxiranes and perfluorooxiranes, the term "fluoroamine" encompasses both hydrofluoroamines and perfluoroamines, the term "fluoroketone" encompasses both hydrofluoroketones and perfluoroketones, and the term "fluoroolefin" encompasses both hydrofluoroolefins and perfluoroolefins. It can thereby be preferred that the fluoroether, the oxirane, the fluoroamine and the fluoroketone are fully fluorinated, i.e. perfluorinated.

In embodiments, the dielectric insulation medium is selected from the group consisting of: a (or several) hydrofluoroether(s), a (or several) perfluoroketone(s), a (or several) hydrofluoroolefin(s), and mixtures thereof.

In particular, the term "fluoroketone" as used in the context of the present invention shall be interpreted broadly and shall encompass both fluoromonoketones and fluorodiketones or generally fluoropolyketones. Explicitly, more than a single carbonyl group flanked by carbon atoms may be present in the molecule. The term shall also encompass both saturated compounds and unsaturated compounds including double and/or triple bonds between carbon atoms.

The at least partially fluorinated alkyl chain of the fluoroketones can be linear or branched and can optionally form a ring.

In embodiments, the dielectric insulation medium comprises at least one compound being a fluoroketone, which may optionally comprise also heteroatoms incorporated into the carbon backbone of the molecules, such as at least one of: a nitrogen atom, oxygen atom and sulphur atom, replacing a corresponding number of carbon atoms. More preferably, the fluoromonoketone, in particular perfluoroketone, can have from 3 to 15 or from 4 to 12 carbon atoms and particularly from 5 to 9 carbon atoms. Most preferably, it may comprise exactly 5 carbon atoms and/or exactly 6 carbon atoms and/or exactly 7 carbon atoms and/or exactly 8 carbon atoms.

In embodiments, the dielectric insulation medium comprises at least one compound being a fluoroolefin selected from the group consisting of: hydrofluoroolefins (HFO) comprising at least three carbon atoms, hydrofluoroolefins (HFO) comprising exactly three carbon atoms, trans-1,3,3,3-tetrafluoro-1-propene (HFO-1234ze), 2,3,3,3-tetrafluoro-1-propene (HFO-1234yf), trans-1,2,3,3,3 pentafluoroprop-1-ene (HFO-1225ye (E-isomer)), cis-1,2,3,3,3 pentafluoroprop-1-ene (HFO-1225ye (Z-isomer)), and mixtures thereof.

The dielectric insulation medium can further comprise a background gas or carrier gas different from the organofluorine compound (in particular different from the fluoroether, the oxirane, the fluoroamine, the fluoroketone and the fluoroolefin) and can in embodiments be selected from the group consisting of: air, $N_2$, $O_2$, $CO_2$, a noble gas, $H_2$; $NO_2$, NO, $N_2O$; fluorocarbons and in particular perfluorocarbons, such as $CF_4$; $CF_3I$, $SF_6$; and mixtures thereof.

Figure 2:
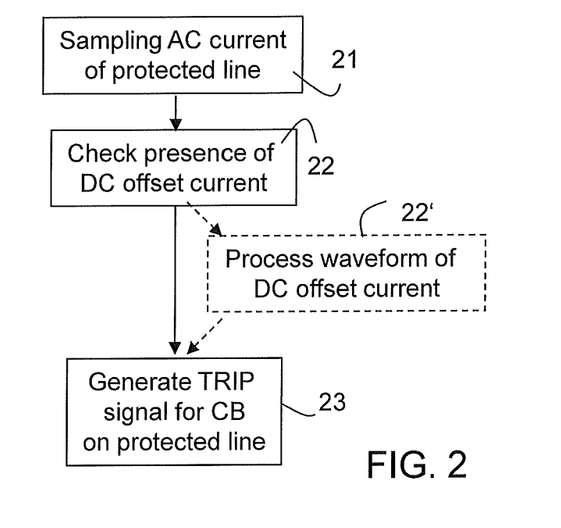
FIG. 2 is a flow chart with steps in accordance with an example of the invention.

The above described protection system for a power line can further be used for a method including steps as illustrated in the flow chart of FIG. 2.

The method includes the step 21 of sampling the AC current waveform on the protected power line 10. The sampling rate is set to follow fast changes or transient in the AC current. Suitable sampling rates are for example 30 kHz, 100 KHz, 1 MHz or higher. The acquisition step is accompanied by a corresponding analysis step 22 executed as described above either directly within the sensor electronics module or within the processing unit of the relay (e.g. microcontroller or digital signal processor (DSP)) on the samples as transmitted from the sensor module via the data transmission lines. The analysis includes a test condition which causes a TRIP signal to be sent in a following step 23 to the circuit breaker(s). In other words, the analyser 141, 16 is testing the direct current component i(tr) for a test condition which causes a control signal TRIP1, TRIP2 to be sent to the circuit breaker 13-1, 13-2, 13-3 in a following step 23. In yet other words, the analyser 141, 16 tests whether the direct current component i(tr) fulfills the test condition (i.e. a predetermined test condition), then generates a control signal as a function of fulfillment or non-fulfillment of the test condition, and in a following step 23 sends the control signal TRIP1, TRIP2 to the circuit breaker 13-1, 13-2, 13-3.

A suitable test condition can be defined for example as the presence of a DC component (at least above a certain threshold). Alternatively or in addition, the analysis can include a step of full or partial waveform reconstruction 22' of the DC offset current signal as described in further details below. Knowledge of the DC offset waveform can be used to perform further tests or comparisons beyond the test for the mere presence of a DC component. For example, by comparing the DC offset current waveform against signature waveforms representative of known fault or non-fault events it is possible to make the method more sensitive and less likely to trigger a TRIP command based on a non-fault event.

Figure 3:
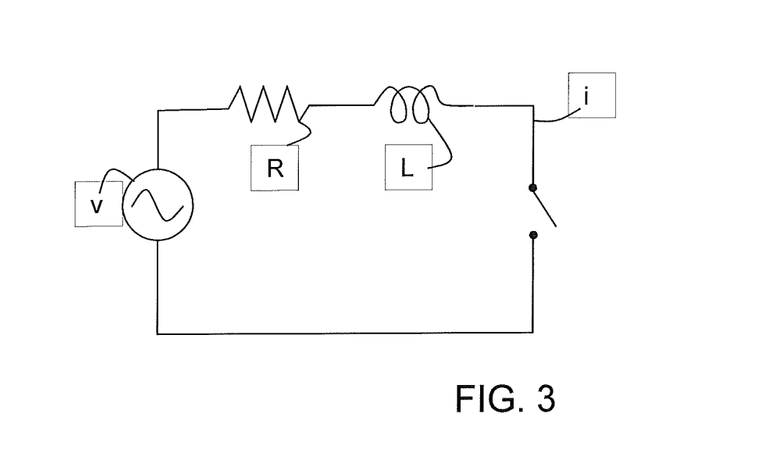
FIG. 3 is a simplified representation of a power line.

A more detailed analysis of the DC component in the power line current can be based for example on an equivalent circuit as shown in FIG. 3. In FIG. 3 the protected line is fed from a voltage source v with $v=sqrt(2)*V*sin(\omega t+a)$, e.g., as provided by a synchronous generator, with $sqrt(2)*V$ being the amplitude value of the voltage. The transmission line can be represented by a lumped resistance-inductance R-L series circuit as shown, with negligible line capacitance. To simplify the analysis, it can be assumed that the short circuit takes place when the line is unloaded. Under these conditions, the total current i would be a sum of two components i(ss) and i(tr). The steady state symmetrical short circuit current i(ss) can be represented mathematically by $i(ss)=sqrt(2)*V/(|Z|*sin(\omega t+\alpha-\theta))$, with Z being the line impedance represented by $Z=sqrt(R^2+\omega^2 L^2)$ and $\theta=tan^{-1}(\omega L/R)$. The phase lag $\alpha$ or fault inception angle represents a measure for the time at which a fault occurred relative to the voltage cycles.

The second component is a transient DC current also referred to as DC offset current i(tr), which can be represented mathematically by $i(tr)=sqrt(2)*V/(|Z|*sin(\theta-\alpha)exp(-Rt/L))$. Thus, the DC offset current can be expected to decay exponentially with a time constant proportional to the ratio R/L.

Figure 4A:
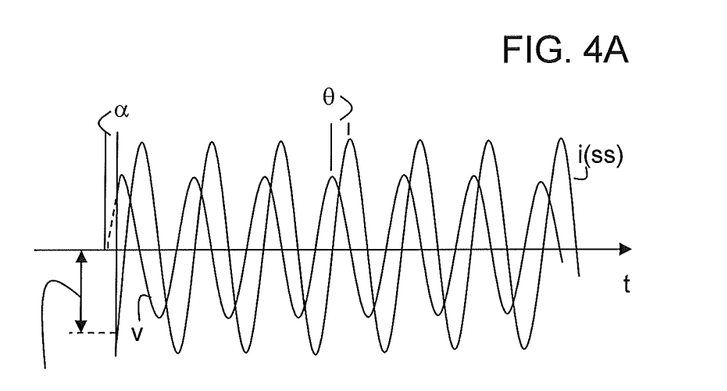
FIGS. 4A-4C illustrate voltages and currents during a fault.
Figure 4B:
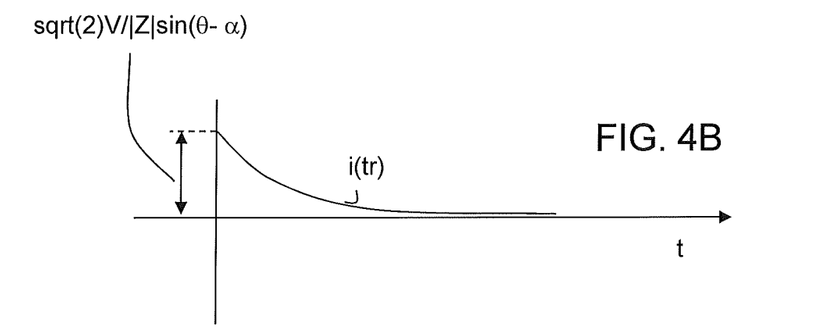
Figure 4C:
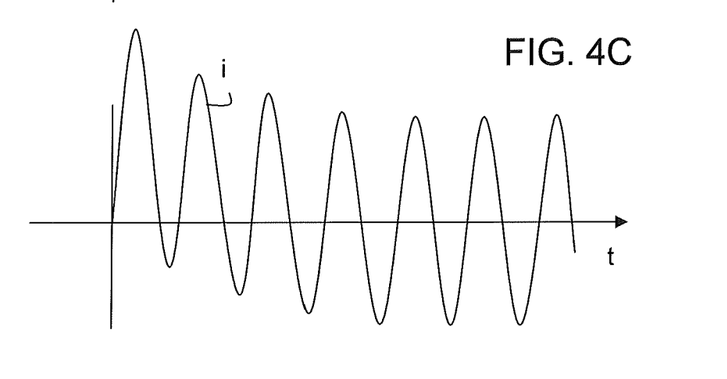

The above waveforms are further illustrated in the event of a fault in FIGS. 4A, 4B, 4C. The AC voltage v and the symmetrical short circuit current i(ss) are shown in FIG. 4A. The decaying DC offset current over time is shown in FIG. 4B and the total current i in FIG. 4C. The maximum momentary short circuit happens at the first peak. And it can easily be shown that it reaches a maximum at $\alpha=0$. Thus, the short circuit current in steady state is increased due to the superposition of the symmetrical short circuit current i(ss) with the exponentially decaying DC offset component i(tr).

With the knowledge of such a model for the DC offset current it is possible to derive a representative of the full waveform or at least of a time section of the full waveform after a short period of sampling yielding only a few (initial) points on the wave curve as shown. Typically the required measurement can be performed in less than half a cycle time, or, when compared to the cycle time, practically instantaneously.

The dc offset component is a parameter that is absent during normal power systems operation and only occurs during a short circuit. Therefore, a measurement of the presence of the dc offset and/or its waveform can be used to monitor power system faults.

Figure 5:
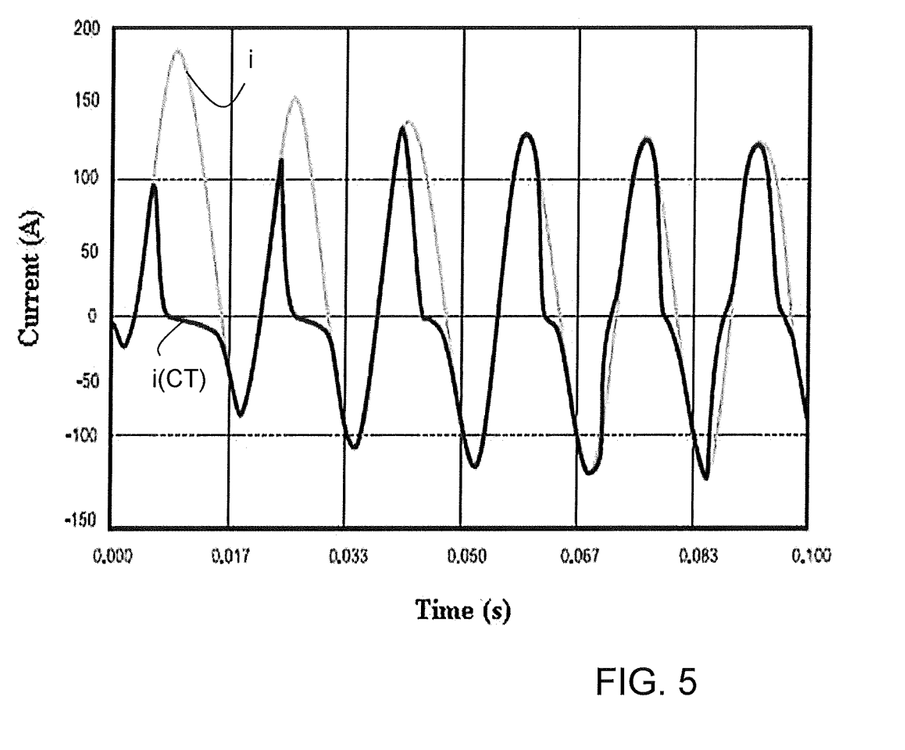
FIG. 5 illustrates the performance of a device in accordance with the invention compared with known devices.

However, in the known CT systems the dc offset component could saturate the CT core, as shown in FIG. 5, which reproduces current measurements i(CT) using a CT during a fault overcurrent as published by R. Hunt cited above. Comparing the curves i and i(CT), FIG. 5 shows how significantly the CT current i(CT) can deviate from the true waveform of the total current i, particularly at the onset of the fault, where the DC offset current is a maximum. The i(CT) only reflects the true waveform after the DC offset current has decayed.

Therefore, conventional CT signals do not provide a good and early measure for the occurrence of a fault in the protected power line. The FOCS on the other hand is capable of measuring the waveform of the AC current precisely even in the event of a sudden overcurrent and a sampling of the current i in FIG. 5 would result in a close match with the actual curve i.

While there are shown and described presently preferred embodiments of the invention, it is to be understood that the invention is not limited thereto but may be otherwise variously embodied and practised within the scope of the following claims. In particular, any current probe capable of measuring the AC waveform of the current in the protected line without the distortion introduced by the CT saturation can be used to replace the FOCS.

What is claimed is:

1. A power line protection system comprising:
   a current meter for monitoring a current in a protected power line, and
   a circuit breaker,
   wherein the current meter comprises a sensor that monitors a direct current component in the current transmitted and comprises an analyser that tests the direct current component for a test condition which causes a control signal to be sent to the circuit breaker in a following step,
   wherein the sensor for monitoring the direct current component is a fiber optic current sensor, and
   wherein the analyser is sensitive to the onset of the direct current component and is programmed to use the onset of the direct current component to generate a control or trip event for the circuit breaker.

2. The power line protection system of claim 1, wherein the analyser is adapted to determine a representative of the waveform of the direct current component.

3. The power line protection system of claim 1, wherein the analyser includes a step of full or partial waveform reconstruction of a DC offset current signal.

4. The power line protection system of claim 3, wherein the DC offset current waveform is compared against signature waveforms representative of known fault or non-fault events.

5. The power line protection system of claim 1, wherein the analyser is part of a current sensor module receiving and processing analog input from the fiber optic current sensor.

6. The power line protection system of claim 1, wherein the analyser is part of a relay connected to a current sensor module receiving analog input from the fiber optic current sensor via a broadband data transmission link.

7. The power line protection system of claim 1, wherein the system is adapted to generate a fault signal for the circuit breaker within one cycle time or less.

8. The power line protection system of claim 7, wherein the system is adapted to generate a fault signal for the circuit breaker within half a cycle time or less.

9. The power line protection system of claim 1, wherein the system is integrated into a protection system of a primary substation connected to power lines operating at a voltage of at least 35 kV.

10. The power line protection system of claim 1, wherein the current sensor is installed in a sulphur hexafluoride free housing.

11. The power line protection system of claim 1, wherein the current sensor is installed in a housing comprising a dielectric insulation medium.

12. The power line protection system of claim 1, wherein the analyser tests whether the direct current component fulfils the test condition, generates the control signal as a function of fulfilment or non-fulfilment of the test condition, and in the following step sends the control signal to the circuit breaker.

13. The power line protection system of claim 1, wherein the test condition is defined by a presence of the direct current component.

14. A method of protecting a power line, comprising:
    monitoring a current in a protected power line,
    detecting a direct current component in the current transmitted,
    analysing the direct current component for a test condition, and
    analysing a representative of the waveform of the direct current component,
    generating a fault signal for a circuit breaker based on the test condition,
    wherein a sensor for monitoring the direct current component is a fiber optic current sensor.

15. The method of claim 14, wherein the current is sampled with a sampling rate of 100 kHz or more.

16. The power line protection system of claim 11, wherein the dielectric insulation medium is a dielectric insulation gas, which comprises an organofluorine compound selected from the group consisting of: a fluoroether, an oxirane, a fluoroamine, a fluoroketone, a fluoroolefin; and mixtures and/or decomposition products thereof.

17. The power line protection system of claim 13, wherein the test condition is defined by the presence of the direct current component above a threshold.

18. A power line protection system comprising:
    a current meter for monitoring a current in a protected power line, and
    a circuit breaker,
    wherein the current meter comprises a sensor that monitors a direct current component in the current transmitted and comprises an analyser that tests the direct current component for a test condition which causes a control signal to be sent to the circuit breaker in a following step,
    wherein the sensor for monitoring the direct current component is a fiber optic current sensor, and
    wherein the analyser is adapted to determine a representative of the waveform of the direct current component.

* * * * *